United States Patent [19]

Delaite

[11] Patent Number: 4,814,662
[45] Date of Patent: Mar. 21, 1989

[54] PIEZOELECTRIC RESONATOR WITH EITHER MINIMAL OR EXTREME SENSITIVITY TO EXTERNAL PRESSURE STRESSES

[75] Inventor: Richard C. Delaite, Belfort, France

[73] Assignee: Etat Francais as represented by the Delegue General pour l'Armement, Paris, France

[21] Appl. No.: 89,038

[22] Filed: Aug. 24, 1987

Related U.S. Application Data

[63] Continuation of Ser. No. 872,402, Jun. 10, 1986, abandoned.

[30] Foreign Application Priority Data

Jun. 14, 1985 [FR] France ............................... 85 09058

[51] Int. Cl.$^4$ ............................................. H01L 41/08
[52] U.S. Cl. .................................... 310/348; 310/338; 310/346; 310/369
[58] Field of Search ............... 310/338, 348, 346, 354, 310/361, 353, 356, 369

[56] References Cited

U.S. PATENT DOCUMENTS

| | | | |
|---|---|---|---|
| 2,161,980 | 6/1939 | Runge et al. | 310/369 X |
| 2,482,661 | 9/1949 | Dimmick | 310/249 |
| 2,509,478 | 5/1950 | Caroselli | 310/346 |
| 3,561,832 | 2/1971 | Karrer et al. | 310/361 X |
| 3,617,780 | 11/1971 | Benjaminson et al. | 310/361 X |
| 4,135,108 | 1/1979 | Besson | 310/361 X |
| 4,317,059 | 2/1982 | Besson | 310/346 X |
| 4,454,443 | 6/1984 | Lukaszek et al. | 310/369 X |
| 4,550,610 | 11/1985 | Eer Nisse | 310/338 X |
| 4,562,375 | 12/1985 | Besson et al. | 310/338 |
| 4,631,437 | 12/1986 | Ballato | 310/348 X |

FOREIGN PATENT DOCUMENTS 513471  5/1976  U.S.S.R. ............................ 310/346

Primary Examiner—Mark O. Budd
Attorney, Agent, or Firm—Parkhurst, Oliff & Berridge

[57] ABSTRACT

Piezoelectric resonator with maximum sensitivity to external pressure stresses.

The resonator includes means (2,3) for exerting nonlocalized radial compressive forces uniformly over diametrically opposed peripheral zones of the crystal (1) in which the zones occupy a predetermined sector $2\alpha$ of at least approximately 110° and are oriented so that the bisectors (A—A) of the peripheral zones form a predetermined angle $\psi$ with the crystallographic X axis of the crystal.

Depending on the value of $\psi$, it is possible to minimize or, on the contrary, maximize the sensitivity of the resonator to the external pressure stresses.

7 Claims, 4 Drawing Sheets

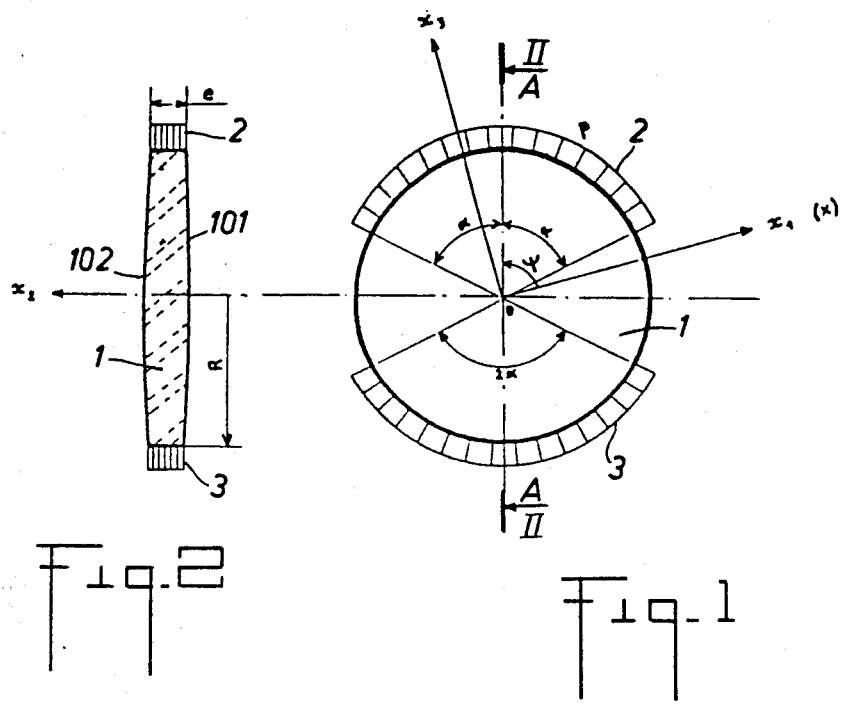
Fig.1
Fig.2
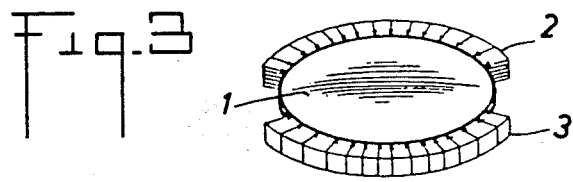
Fig.3
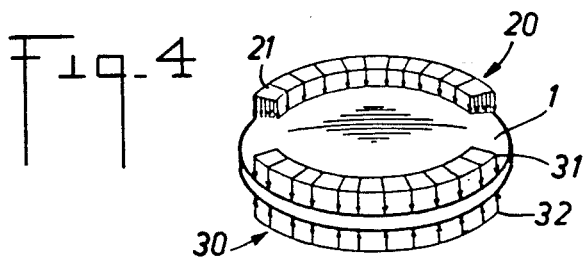
Fig.4

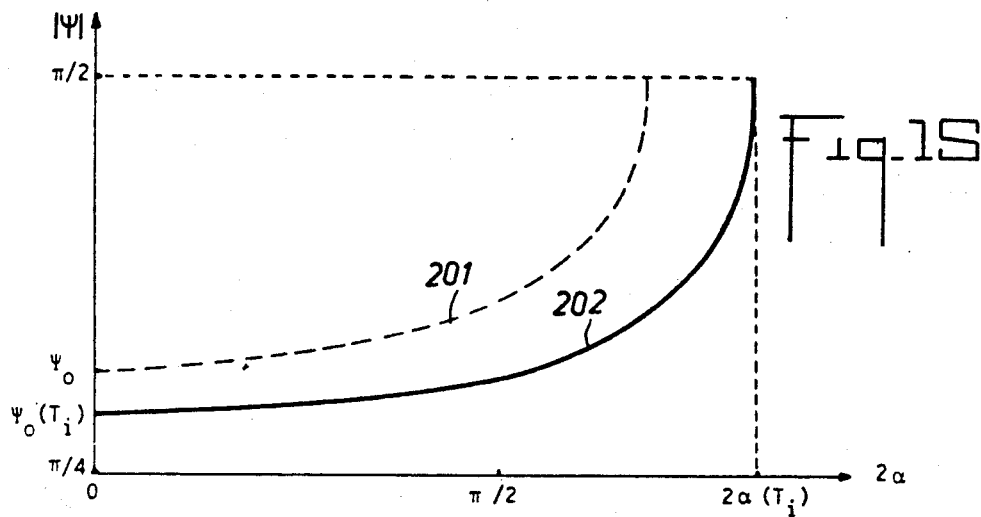
Fig_15
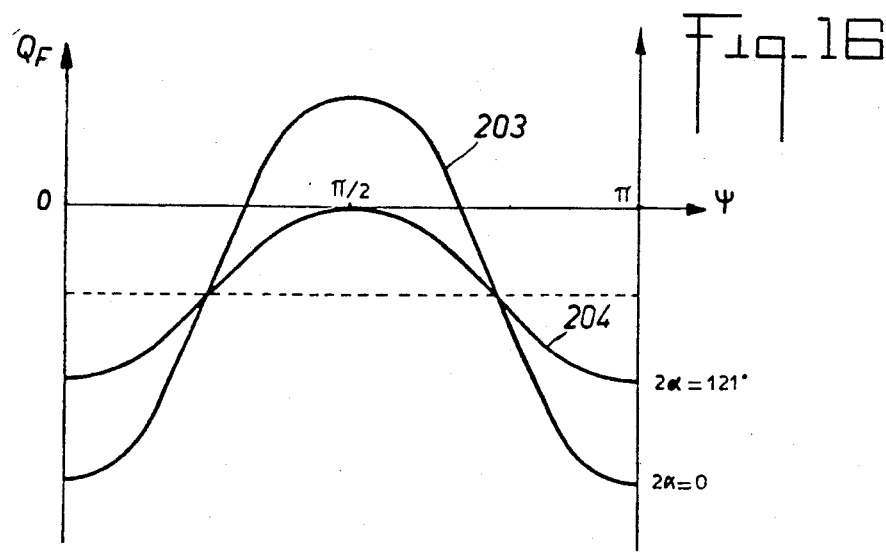
Fig_16
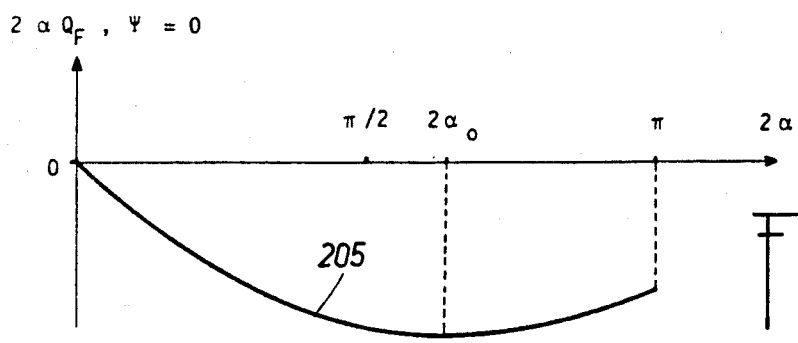
Fig_17

PIEZOELECTRIC RESONATOR WITH EITHER MINIMAL OR EXTREME SENSITIVITY TO EXTERNAL PRESSURE STRESSES

This is a continuation of application Ser. No. 872,402, filed June 10, 1986, now abandoned.

BACKGROUND OF THE INVENTION

1. Field of the Invention

The present invention pertains to piezoelectric resonators with extreme sensitivity to external pressure stresses, including a piezoelectric crystal made of a circular plate with at least one circle face, first and second electrodes each operating with one face of the crystal and means of holding the vibrating part of the crystal, applied to the edge of the crystal itself.

2. State of the Prior Art

Various examples of piezoelectric resonators of the abovementioned type are known.

According to one classical example, the resonator crystal is made of a circular plate of plane-convex or biconvex quartz, on the front faces of which metal electrodes, called adherent electrodes, are deposited directly.

According to another example of construction, the quartz plate with adherent electrodes surrounded by a quartz crown that acts as a support for the resonator crystal.

According to another example of construction, the resonator crystal is connected to a quartz crown by bridges cut in the crystal itself. The electrodes can be adherent or non-adherent and, in the latter case, the electrodes are deposited on quartz plates cut at the same angle as the crystal and the similar shape, and only the crowns of the electrode support plates are in contact with the vibrating crystal crown.

In these various examples of resonators, it is generally attempted to minimize the effect of all of the external pressures exerted on the resonator crystal, to create a time base offering a very stable frequency.

For resonator applications in the field of hydrostatic pressure transducers, on the other hand, it is desirable to increase the sensitivity of the resonator to external pressure stresses.

In one case or in the other the existing systems do not allow simple construction of a resonator with optimum sensitivity to external pressure forces.

SUMMARY OF THE INVENTION

The present invention aims precisely at constructing a piezoelectric resonator with a simple structure that endows the resonator with an extreme sensitivity to external pressure stresses.

This is achieved with a piezoelectric resonator of the type defined at the beginning of the description which, according to the invention, includes means for inserting compressive or delocalized radial tensile forces uniformly over diametrically opposed portions of the crystal perimeter covering a predetermined sector angle $2\alpha$ of at least 110°, approximately, and oriented in such a way that the bisectors of the sectors on the perimeter form a predetermined angle $\psi$ of approximately 0° or 90° with respect to the X axis of the crystal.

According to a first embodiment, the means for exerting forces on the perimeter zones of the crystal includes a circular ring in a piezoelectric material having the same cut and orientation as the vibrating crystal, which is adjusted and pressed radially inward against the edge of the crystal in zones extending along the angular sectors defined by the diametrically opposed perimeter zones of the crystal, and the circular ring includes intermediate parts that are radially set off from the edge of the crystal and are located between the zones of radial pressure.

According to another embodiment, the means for exerting forces on the zones on the perimeter of the crystal include a first and second circular ring in piezoelectric material cut and oriented the same way as the vibrating crystal, which are placed symmetrically on either side of the vibrating crystal on circular zones around the periphery of the crystal faces and are in contact with the crystal at the diametrically opposed zones on the perimeter of the crystal. Between the zones of pressure the rings are recessed axially from the faces of the crystal and the rings fit against the faces of the crystal, pressing along the zones on the perimeter of the crystal.

Furthermore, according to a particular feature of the invention, in the case of the electrodes adhering to the crystal on the center part of the front faces of the crystal, it is advantageous that the electrodes each extend over two diametrically opposed sectors opening out over a predetermined angle $2\alpha$ of at least 110°, approximately, and oriented in such a way that the bisectors of the sectors form a predetermined angle $\psi$ of approximately 0° or 90° with respect to the crystallographic X axis of the crystal.

According to the embodiment aiming at minimizing the sensitivity of the resonator to external stresses, the resonator includes an AT-cut quartz crystal placed at room temperature. The bisectors (A—A) of the zones on the perimeter form an angle $\psi$ of 90° with respect to the crystallographic X axis of the crystal and the predetermined sector angle $2\alpha$ of the perimeter zones is of the order of 120°.

According to another embodiment, also aimed at minimizing the sensitivity of the resonator to external stresses, the resonator includes an AT-cut crystal placed at its frequency inversion temperature, the bisectors (A—A) of the perimeter zones form an angle $\psi$ of 90° with respect to the X axis of the crystal and the predetermined sector angle $2\alpha$ of the perimeter zones is 142°.

According to one embodiment of resonator according to the invention, adapted to exhibit maximum sensitivity to the external stresses, the resonator includes an AT-cut quartz crystal placed at room temperature. The bisectors (A—A) of the perimeter zones form an angle $\psi$ of 0° with respect to the X axis of the crystal and the predetermined angular sector $2\alpha$ of the perimeter zones is 114°.

BRIEF DESCRIPTION OF THE DRAWING

Further advantages and features of this invention will be apparent from the following detailed description of several embodiments of this invention with reference to the corresponding accompanying drawings in which:

FIG. 1 is a plan view showing the principle of a resonator according to the invention;

FIG. 2 is a sectional view along the II—II plane of FIG. 1;

FIGS. 3 and 4 are perspective views showing two different embodiments of a compression resonator oriented according to the invention;

FIG. 15 shows the curves indicating the variation of the orientation side of the radial compression exerted on the resonator as a function of the sector angle $2\alpha$ over which this radial compression is applied, for an AT-cut quartz crystal at 25° C. (dotted line) and at the frequency inversion temperature of the crystal (solid line), thus defining a resonator having null frequency variations regardless of the compression variations uniformly distributed over a diameter of the crystal perimeter;

FIG. 16 gives two curves indicating the sensitivity of an AT-cut quartz crystal at 25° C. as a function of the orientation $\psi$ of the radial compression exerted on the resonator, both for a sector angle $2\alpha$ of zero and of 121°; and FIG. 17 gives the curve representing the sensitivity of the resonator as a function of the sector angle $2\alpha$ over which the radial compression is exerted on the resonator, for an AT-cut crystal at 25° C.

DETAILED DESCRIPTION OF THE PREFERRED EMBODIMENT

Figure 5:
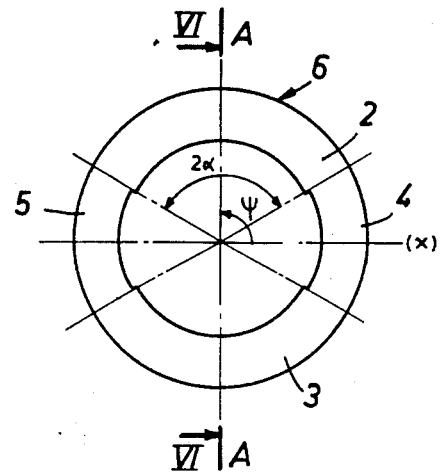
FIG. 5 is a plan view of an example in use of the embodiment in FIG. 3.

FIGS. 1 and 2 show a quartz crystal resonator 1 with its crystallographic axes $x_1$, $x_2$, $x_3$, the axes $x_1(X)$ and $x_3$ being located in the plane of FIG. 1 and the axis $x_2$ being perpendicular to the plane of the FIG. 1.

The crystal 1 is bounded by a circular perimeter of radius R and has a thickness e around its periphery. The front faces 101, 102 are spherical to trap the energy at the center of the crystal. It will be noted, however, that the crystal 1 is not necessarily biconvex. It is sufficient that at least one of the faces 101, 102 be spherical.

The crystal 1 cooperates with two electrodes that are not shown in FIG. 1 or 2 but are located facing the active central portion of the front faces 101, 102. The electrodes may adhere to crystal 1 or may not adhere, in which case they are held by plates arranged on either side of the crystal 1. In both cases the resonator crystal 1 vibrates in shear mode through the thickness.

Generally, the vibration frequency of the resonator crystal 1 is disturbed by external stresses applied to the crystal.

To remedy this disadvantage and have a resonator crystal secured in such a way that the influence of the external pressure stresses on the frequency can be controlled, in particular to achieve a null effect or, on the contrary, a maximum effect according to the invention, a compression p or radial extension is applied uniformly over two diametrically opposed zones of the crystal periphery covering a predetermined sector angle $2\alpha$, and are oriented with respect to the crystal 1, the bisectors A—A of the two compression or extension zones forming a predetermined angle $\psi$ with respect to the X axis of the quartz crystal (FIG. 1).

We thus create at the center of the crystal a stress state which, depending on the angles $2\alpha$ and $\psi$, is characterized either by a null effect or by a maximum effect of the external stresses on the resonator frequency, depending on whether the resonator is being used as a time base or, on the contrary, as a force transducer.

The values of the orientation angle $\psi$ and of the sector angle $2\alpha$ of the compression or radial extension zones must be adapted as a function of the following characteristics:

the nature and the performance of the quartz used as resonator crystal the cut of the crystal with the angles corresponding to a single or double rotation the operating temperature, which is generally that of the temperature-frequency curve inversion point.

As an example, we consider below the cases of an AT-cut quartz crystal.

In this case, it has been established that the relative frequency variation of the crystal subjected to external stresses on its edge can be expressed according to the following equation:

$$\frac{\overline{f_k} - f_k}{f_k} = \frac{-F}{2c_{66} 2h_a \pi R} \left( 2(k_3 - k_1) \frac{\sin 2\alpha}{2\alpha} \cos 2\psi - (k_1 + k_3) \right) \quad (1)$$

where $c_{66}$ is an elastic coefficient of the first order for the quartz, $K_1$ and $K_3$ are the coefficients expressing the elastic and flexibility coefficient of the second and third order for the quartz, $2h_o$ is the thickness of the crystal, R is the radius of the crystal, $2\alpha$ is the sector angle of the diametrically opposed stressed zones on the periphery of the crystal, $\psi$ is the angle formed by the bisectors of the diametrically opposed stressed zones with respect to the X axis of the crystal, $F = 2\alpha 2h_0 R p$, p is the pressure exerted on the edge of the crystal.

For a temperature of 25° C., the numerical values are:

$k_1 = 0.957$
$k_3 = 0.103$
$1/(2.c_{66}) = 1.722 \times 10^{-11} N^{-1} m^2$.

Starting with relation (1), a coefficient can be introduced to represent the sensitivity $Q_F$ of the resonator to variations in the external stresses, determined by the following relation:

$$Q_F = 2(k_3 - k_1) \frac{\sin 2\alpha}{2\alpha} \cos 2\psi - (k_1 + k_3) \quad (2)$$

In practice, it is known that the forces F holding the crystal change with time and thus do not allow a stable stress state at the center of the crystal. The phenomena related, in particular, to the stress relaxation in the securing structure as well as those related to the differential expansions among the various elements are the cause for this. Even if it is possible to increase the stability of the forces for securing the resonator crystal, it is not likely that a very high stability would be achieved by holding constant the force F and the sensitivity coefficient $Q_F$, or even by holding the product $F \cdot Q_F$ constant.

According to the invention, the orientation angle and the sector angle $2\alpha$ are chosen so that the sensitivity coefficient $Q_F$ is zero under the expected operating conditions.

This zero value condition for the coefficient $Q_F$ is achieved when:

$$\psi = \tfrac{1}{2} \cos^{-1}(K2\alpha/\sin 2\alpha) \qquad (3)$$

where $$K = k_1 + k_3/2(k_3 - k_1) \qquad (4)$$

and where $\psi$, $2\alpha$, $k_1$ and $k_3$ stand for the same things as indicated for equations (1) and (2).

When equation (3) holds, the frequency variation is zero regardless of the variation in the compression uniformly distributed over a diameter zone of the crystal perimeter.

The modulus of $\psi$ as a function of the sector angle $2\alpha$ corresponding to this condition are given by the dotted curve 201 in the FIG. 15 for an AT-cut crystal at 25° C., and by the solid curve 202 in FIG. 15 for the same crystal at its frequency inversion temperature $T_i$, which typically corresponds to 78° C. The coefficient K, in effect, varies with the temperature.

Several possibilities are shown in FIGS. 9 to 12 for the position and extent of the means 2,3 creating distributed compression zones at the edge of the crystal so that the value of the sensitivity coefficient $Q_F$ is zero. The FIGS. 9 to 12 thus show four examples of ($\psi$, $2\alpha$) value pairs taken from the curve 201 in FIG. 15.

Figures 9, 10, 11, 12:
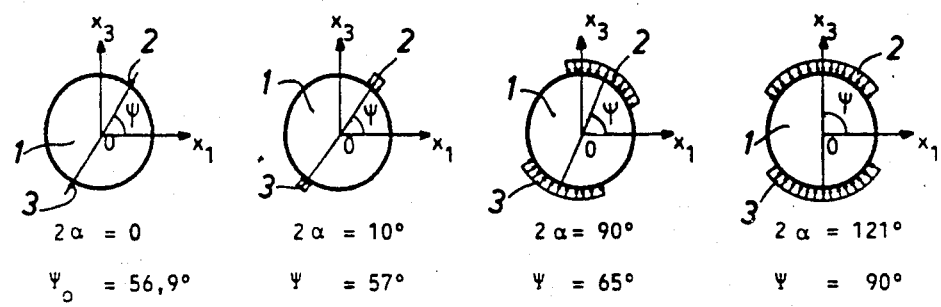
FIGS. 9 to 12 represent different plan views analogous to FIG. 1 and corresponding to configurations approaching closer and closer to an optimum configuration in which the sensitivity of the resonator to external stresses is minimized.

FIG. 9 illustrates the case of a crystal compressed by two diametrically opposed localized forces ($2\alpha = 0$) applied at an angle $\psi = 56.9°$ with respect to the crystal axis $x_1$. It is observed that, in such a case, the position of the means 2,3 applying the force to the crystal must be very accurate if the condition $Q_F = 0$ is to be met, which makes the assembly difficult.

In FIG. 10, the angle $\psi$ defining the direction of the forces with respect to the crystal axis $x_1$ is 57°, which implies that the radial force is distributed uniformly over a sector angle $2\alpha = 10°$ to either side of a line lying at an angle $\psi$ from the $x_1$ axis. Here again, the assembly must be very accurate and such a case cannot be considered satisfactory in practice.

FIG. 11 shows a possibility that could be acceptable in practice as long as the sector angle $2\alpha$ over which the forces are exerted uniformly at the edge of the crystal is 90°, with an orientation $\psi = 65°$ with respect to the $x_1$ axis of the crystal.

FIG. 12 shows an optimum case for which the resonator is least sensitive to external stresses. This corresponds to an orientation of $\psi = 90°$ and entails a sector angle $2\alpha = 121°$.

It will be noted that the large values for the sector angle $2\alpha$ correspond to a reduction in the sensitivity of the resonator crystal 1 to the stresses applied to it. In practice, then, it is advantageous to choose a sector angle $2\alpha$ that is large enough, for example greater than some 110°, and to position the means 2,3 for distributing the compression or radial extension stresses around the edge of the crystal in such a way that the bisectors of the diametrically opposed sectors make an angle $\psi$ with the $x_1$ axis so that relation (3) is satisfied.

FIG. 16 compares the curve of the sensitivity $Q_F$ versus the angle $\psi$ for the cases where $2\alpha = 0°$ (curve 204) and $2\alpha = 121°$ (curve 204) for an AT-cut quartz crystal at 25° C.

It can be seen that, at the maximum value for $2\alpha$, a coefficient $Q_F$ can be obtained that has a zero slope at the point $\psi = \pi/2$, which corresponds to the case of FIG. 12 where it is attempted to minimize the effect of the external stresses on the frequency of the resonator crystal 1.

A configuration such as the one in FIG. 12 thus makes it possible to eliminate the effect any fabrication defects may have and to achieve maximum reduction of the accelerometric effect while still increasing the impact strength. A slight defect in the positioning of the radial compression means 2,3 with respect to the optimum value of $\psi = \pi/2$ is not a problem in this case, as it would be on the contrary in the FIGS. 9 and 10 or, to a lesser extent, in the FIG. 11.

Considering curve 202 in FIG. 15, it is observed that optimum limit position for minimizing the effect of the external stresses on the frequency of the crystal is always $\psi = \pi/2$. However, considering the higher temperature that corresponds to the crystal inversion temperature, the maximum value of the compression sector angle $2\alpha$ corresponding to the angle $\psi = \pi/2$ becomes 142°.

According to another application of the invention in which the resonator crystal is used as a transducer for pressure measurements, it is desired to maximize the sensitivity coefficient $Q_F$.

For a uniform hydrostatic pressure p applied over a sector angle $2\alpha$ of the crystal, the maximum frequency variation is given by relation (1) for the position $\psi = 0$.

In this case, the relation (1) becomes:

$$\frac{\overline{f_k} - f_k}{f_k} = \frac{-p}{2c_{66}\pi} 2\alpha \left\{ 2(k-k)\frac{\sin 2\alpha}{2\alpha} 1 - (k_3 + k) \right\} \qquad (5)$$

As the curve 205 in FIG. 17 shows, the sensitivity is maximum when the sector angle $2\alpha$ is such that the product $2\alpha Q_F$ takes on a maximum value.

For the case of the curve in FIG. 17 that corresponds to an AT-cut quartz crystal at 25° C., with an angle $\psi = 0°$, the value of $2\alpha_0$ is 114°.

As in the case of a search for a zero coefficient of sensitivity $Q_F$, a large sector angle $2\alpha$ should thus be chosen; but in the search for maximum sensitivity the angle $\psi$ should be close to zero and not close to $\pi/2$.

To achieve an extremum (i.e. a minimum or maximum) of sensitivity of a piezoelectric resonator with respect to the external pressure stresses, a compression or, equivalently a radial tension should be applied that is uniformly distributed over limited but substantial zones of the periphery of the crystal and that is oriented with respect to the crystallographic axis of the crystal.

According to the invention, the radial compression is obtained by pressure distributors consisting of circular rings in quartz with recesses corresponding to the zones of noncompression.

Figure 6:
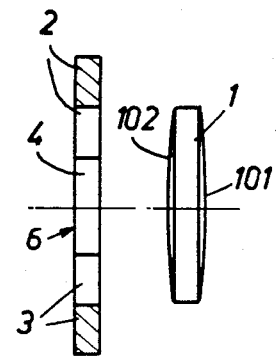
FIG. 6 is a section along the VI—VI plane in FIG. 5, depicted in an exploded view.

FIGS. 3, 5 and 6 concern a first embodiment in which the compression exerted radially is applied directly to the edge of the resonator crystal 1 by compression means 2,3 located in the plane of the crystal 1.

An example of pressure distributor 6 corresponding to the schematic in FIG. 3 is represented in FIGS. 5 and 6.

The pressure distributor 6 consists of a ring of quartz having the same section and orientation as crystal 1. Its zones of compression 2,3 over a sector angle 2α are set by pressing on the edge of the crystal according to the orientation with respect to the X axis of the crystal defined as indicated above by the angle ψ between the bisectors A—A of the compression zones 2,3 and the X axis. The pressure distributor 6 features intermediate portions 4,5 corresponding to zones where compression is not applied, but which connect the compression zones 2,3 to each other. These intermediate portions 4,5 are radially recessed from the edge of the crystal so as not to exert any stress on the crystal. The intermediate portions 4,5 are easily cut out from a circular ring that may, for example, have a rectangular cross section, simply by cutting out a recess from the internal wall of the ring in those sectors 4,5 where no compression is to be applied.

Figure 7:
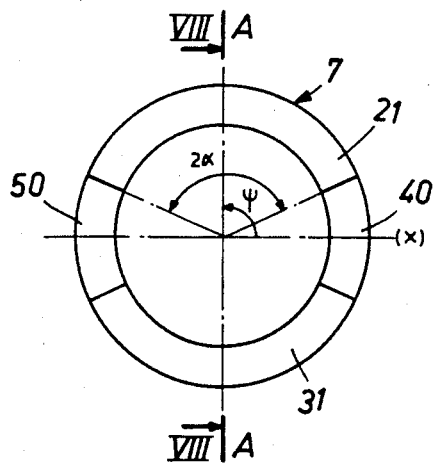
FIG. 7 is a plan view of an example of the use of the embodiment in FIG. 4.
Figure 8:
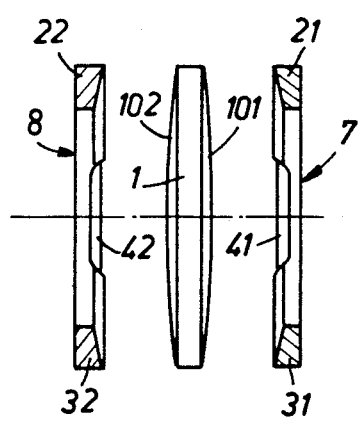
FIG. 8 is a section along the VIII—VIII plane of FIG. 7, depicted in an exploded view.

The FIGS. 4, 7 and 8 concern a second embodiment in which the limited radial compression is obtained by the radial component of a compression that is applied axially to the resonator principle over a circular peripheral zone of its convexity.

In this case, two pressure distributors 7, 8 are placed symmetrically on either side of the resonator crystal 1 and are directly in contact with it in compression zones 21, 31 and 22, 32, respectively. The pressure distributors 7,8 consist of quartz rings having the same cut and orientation as the quartz crystal 1. The noncompression zones 40, 50 are obtained by providing shallow recesses such as 41, 42 in the faces of distributors 7, 8, on the side facing crystal 1, between the compression zones covering the sector angle 2α.

Various means of securing, such as clips or screws, may be used to apply an axial squeezing force on distributors 7, 8 to create indirectly a limited radial compression.

As can be observed, the pressure distributors 6, 7 or 8 are very easy to associate with a classical resonator crystal 1, whether a crystal has adherent electrodes or not. In the case of a resonator crystal with non-adherent electrodes carried by disks on either side of the crystal, the disks and the crystals define peripheral crowns that are in contact with each other. The pressure distributors 6, 7, or 8 can press on the periphery of the crystal assembly and disks supporting electrodes just as if it were a single-piece resonator crystal.

In all cases, the assembly of the crystal 1 with the pressure distributors 6, 7 or 8 is compact, extremely rigid and of a very high level of symmetry, while entailing only simple assembly and machining operations.

However, in the case of a resonator crystal with adherent electrodes, the assembly can be improved independently of the use of pressure distributors 6, 7 or 8, by fabricating slotted electrodes 10, 11 which themselves define the compression or extension zones (FIGS. 13 and 14) analogously to the action of the pressure distributors described above.

The compression or extension phenomenon is then caused by differential expansions due to the differences in the characteristics of the quartz crystal and the deposited metal electrodes.

A uniformly distributed radial compression, (or tensile force) is applied to a limited sector of 2α in a direction ψ, when the temperature is varied, by a special form of the slotted electrodes, properly positioned with respect to the quartz crystal axis and on each face of the crystal.

Figure 13:
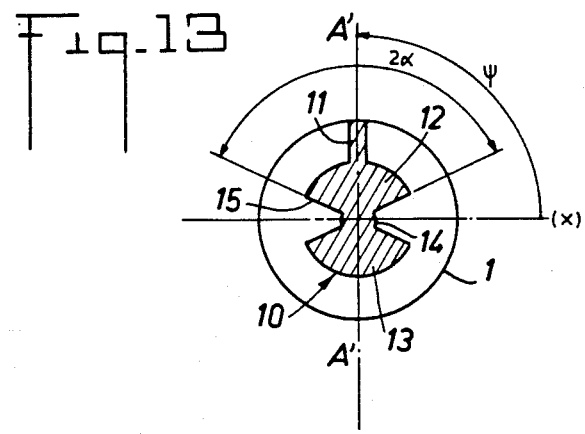
FIG. 13 is a plan view of a resonator fitted with adherent electrodes in a specific configuration according to a feature of the present invention.
Figure 14:
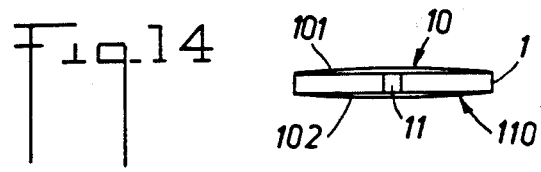
FIG. 14 is an elevation view of the resonator in FIG. 13.

The shape of the electrodes shown in FIG. 13, with diametrically opposed sectors 12, 13 extending over an opening 2, having bisectors A'—A' forming an angle ψ with the crystallographic X axis of the crystal and separated by nonmetalized sectors 14, 15, provides a radial compression of the crystal if the electrode has a lower coefficient of expansion than the crystal, or a radial extension in the opposite case.

If the angle ψ is close to $\pi/2$ and if the angle 2α is large enough, for a given metal, it is possible to eliminate the metal-quartz differential expansion effect and thus get around the frequency variations due to surface stresses during temperature variations.

What I claim is:

1. A piezoelectric resonator with maximum sensitivity to external pressure stresses, including a piezoelectric crystal consisting of a circular plate comprising at least one spherical face, a first electrode and a second electrode each cooperating with one face of the crystal and means for holding a vibrating part of the crystal applied to the periphery of the crystal, wherein said holding means includes means for exerting nonlocalized radial compressive forces uniformly distributed over diametrically opposed zones on the periphery of the crystal covering a predetermined continuous sector of about 110°–114°, and oriented so that the bisectors of said peripheral zones form a predetermined angle close to 0° with respect to the crystallographic X axis of the crystal.

2. The resonator as claimed in claim 1, wherein said means for exerting forces on the peripheral zones of the crystal include a circular ring made of piezoelectric material with the same cut and orientation as the vibrating crystal itself, which ring is adjusted and tightened radially against the edge of the vibrating crystal in zones extending through sectors defined by said diametrically opposed peripheral zones of the crystal, and wherein said circular ring includes intermediate parts radially recessed from the edge of the crystal and located between said radially tightened zones.

3. The resonator as claimed in claim 1, wherein said means for exerting forces on the peripheral zones of the crystal include first and second circular rings made of piezoelectric material having the same cut and orientation as the vibrating crystal, which rings are places symmetrically on either side of the vibrating crystal, pressing on circular and peripheral areas on the faces of the crystal and wherein said rings are in contact with the crystal at the level of the diametrically opposed peripheral zones of the crystal, wherein said rings have intermediate parts axially recessed from the faces of the crystal in intermediate zones between said peripheral zones of the crystal and wherein said rings fit the form of the faces of the crystal and are tightened against said faces at the level of said peripheral zones of the crystal.

4. A piezoelectric resonator with minimum sensitivity to external pressure stresses, including a piezoelectric crystal consisting of a circular plate comprising at least one spherical face, a first electrode and a second electrode each cooperating with one face of the crystal and means for holding a vibrating part of the crystal applied to the periphery of the crystal, wherein said holding means includes means for exerting nonlocalized radial compressive forces uniformly distributed over diametrically opposed zones on the periphery of the crystal covering a predetermined continous sector of about 110°–142°, and oriented so that the bisectors of said peripheral zones form a predetermined angle close to 90° with respect to the crystallographic X axis of the crystal.

5. The resonator as claimed in claim 4, wherein the piezoelectric crystal is an AT-cut quartz crystal at room temperature, and the bisectors of said peripheral zones form an angle of 90° with respect to the crystallographic X axis of the crystal and wherein the predetermined sector angle of said peripheral zones is about 120°.

6. The resonator as claimed in claim 4, wherein said means for exerting forces on the peripheral zones of the crystal include a circular ring made of piezoelectric material with the same cut and orientation as the vibrating crystal itself, which ring is adjusted and tightened radially against the edge of the vibrating crystal in zones extending through sectors defined by said diametrically opposed peripheral zones of the crystal, and wherein said circular ring includes intermediate parts radially recessed from the edge of the crystal and located between said radially tightened zones.

7. The resonator as claimed in claim 4, wherein said means for exerting forces on the peripheral zones of the crystal include first and second circular rings made of piezoelectric material having the same cut and orientation as the vibrating crystal, which rings are placed symmetrically on either side of the vibrating crystal, pressing on circular and peripheral areas on the faces of the crystal and wherein said rings are in contact with the crystal at the level of the diametrically opposed peripheral zones of the crystal, wherein said rings have intermediate parts axially recessed from the faces of the crystal in intermediate zones between the said peripheral zones of crystal and wherein said rings fit the form of the faces of the crystal and are tightened against said faces of the level of said peripheral zones of the crystal.

* * * * *